(12) United States Patent
Walker (10) Patent No.: US 9,130,653 B2
(45) Date of Patent: Sep. 8, 2015

(54) FILTER BLOCK AND A SIGNAL TRANSCEIVER COMPRISING SUCH A FILTER BLOCK

(71) Applicant: Filtronic Wireless Limited, Shipley, West Yorkshire (GB)

(72) Inventor: Stewart Rollo Walker, Guiseley (GB)

(73) Assignee: FILTRONIC WIRELESS LIMITED, Shipley, West Yorkshire (GB)

( * ) Notice: Subject to any disclaimer, the term of this patent is extended or adjusted under 35 U.S.C. 154(b) by 117 days.

(21) Appl. No.: 13/671,850

(22) Filed: Nov. 8, 2012

(65) Prior Publication Data

US 2013/0115897 A1    May 9, 2013

(30) Foreign Application Priority Data

Nov. 8, 2011 (GB) .................................. 1119289.5

(51) Int. Cl.
*H04B 1/46* (2006.01)
*H04B 1/44* (2006.01)
*H03H 7/46* (2006.01)

(52) U.S. Cl.
CPC . *H04B 1/44* (2013.01); *H03H 7/463* (2013.01)

(58) Field of Classification Search
CPC .............. H04B 1/48; H04B 1/44; H04B 1/46; H04B 1/18; H04B 1/40; H04B 1/0003
USPC ........................ 455/561, 78–84; 370/278, 338
See application file for complete search history.

(56) References Cited

U.S. PATENT DOCUMENTS

| | | | | | |
|---|---|---|---|---|---|
| 3,252,113 | A | * | 5/1966 | Veltrop | 333/110 |
| 3,593,209 | A | * | 7/1971 | Gittinger | 333/118 |
| 3,605,044 | A | * | 9/1971 | Seidel | 333/202 |
| 3,748,601 | A | * | 7/1973 | Seidel | 333/109 |
| 3,769,586 | A | * | 10/1973 | Shapiro et al. | 455/129 |
| 3,771,064 | A | * | 11/1973 | Hebert, Jr. | 333/1 |
| 3,883,827 | A | * | 5/1975 | Seidel | 333/112 |
| 3,911,372 | A | * | 10/1975 | Seidel | 330/286 |
| 4,066,912 | A | * | 1/1978 | Wetherell | 307/3 |
| 4,207,547 | A | * | 6/1980 | Buck | 333/209 |
| 4,426,630 | A | * | 1/1984 | Folkmann | 333/174 |
| 4,492,960 | A | * | 1/1985 | Hislop | 342/175 |
| 4,905,239 | A | * | 2/1990 | Lockwood et al. | 370/497 |
| 5,101,171 | A | * | 3/1992 | Redmond | 330/124 R |
| 5,180,999 | A | * | 1/1993 | Edwards | 333/175 |
| 5,196,811 | A | * | 3/1993 | Andersen | 331/135 |
| 6,067,053 | A | * | 5/2000 | Runyon et al. | 343/797 |
| 6,445,904 | B1 | * | 9/2002 | Lovinggood et al. | 455/7 |
| 6,870,928 | B1 | * | 3/2005 | Conroy et al. | 379/399.01 |

(Continued)

*Primary Examiner* — Edward Urban
*Assistant Examiner* — Rui Hu
(74) *Attorney, Agent, or Firm* — Howard & Howard Attorneys PLLC (57) ABSTRACT

A filter block comprising
  a hybrid filter, the hybrid filter comprising
    a first signal splitter having a first input port and a first output port;
    a second signal splitter having a first input port and a first output port;
    each of the first and second splitters having first and second connection ports;
    the two first connection ports being connected together by a first signal path comprising a first filter;
    the second two connection ports being connected together by a second signal path comprising a second filter;
    the first and second signal paths each further comprising a transformer connected between the filter and one of the first and second signal splitters.

12 Claims, 8 Drawing Sheets

(56) References Cited

U.S. PATENT DOCUMENTS

| | | | |
|---|---|---|---|
| 6,934,511 B1* | 8/2005 | Lovinggood et al. | 455/11.1 |
| 7,039,357 B2* | 5/2006 | Weissman et al. | 455/16 |
| 7,072,611 B2* | 7/2006 | Shapira | 455/7 |
| 7,388,885 B2* | 6/2008 | Heise et al. | 370/480 |
| 7,453,943 B2* | 11/2008 | Kuo et al. | 375/257 |
| 7,834,686 B2* | 11/2010 | Staszewski et al. | 330/51 |
| 8,041,313 B2* | 10/2011 | Van Rensburg et al. | 455/90.2 |
| 8,149,742 B1* | 4/2012 | Sorsby | 370/278 |
| 8,630,581 B2* | 1/2014 | Judd et al. | 455/24 |
| 2001/0027091 A1* | 10/2001 | Kimishima | 455/209 |
| 2003/0060160 A1* | 3/2003 | Yuan et al. | 455/12.1 |
| 2003/0073463 A1* | 4/2003 | Shapira | 455/562 |
| 2004/0192233 A1* | 9/2004 | Mitzlaff | 455/127.1 |
| 2005/0141697 A1* | 6/2005 | Hsieh | 379/390.04 |
| 2006/0052065 A1* | 3/2006 | Argaman et al. | 455/101 |
| 2006/0192711 A1* | 8/2006 | Haskell | 342/372 |
| 2006/0273869 A1* | 12/2006 | Jachowski | 333/204 |
| 2009/0041157 A1* | 2/2009 | Small | 375/302 |
| 2009/0318092 A1* | 12/2009 | Maoz et al. | 455/73 |
| 2010/0102899 A1* | 4/2010 | Engel | 333/117 |
| 2010/0308911 A1* | 12/2010 | Beaudin et al. | 330/185 |
| 2011/0069644 A1* | 3/2011 | Kim et al. | 370/278 |
| 2011/0070927 A1* | 3/2011 | Gilmore | 455/573 |
| 2011/0081878 A1* | 4/2011 | Kenington | 455/213 |
| 2011/0187477 A1* | 8/2011 | Kunes | 333/132 |
| 2012/0161904 A1* | 6/2012 | Do et al. | 333/202 |
| 2012/0212304 A1* | 8/2012 | Zhang et al. | 333/174 |
| 2013/0083703 A1* | 4/2013 | Granger-Jones et al. | 370/277 |
| 2013/0090080 A1* | 4/2013 | Schmidt | 455/307 |
| 2013/0100971 A1* | 4/2013 | Kunes et al. | 370/537 |

* cited by examiner

FILTER BLOCK AND A SIGNAL TRANSCEIVER COMPRISING SUCH A FILTER BLOCK

The subject patent application claims priority to and all the benefits of Great Britain Patent Application No. GB 1119289.5, which was filed on Nov. 8, 2011 with the Great Britain Intellectual Property Office, the disclosure of which is hereby incorporated by reference.

The present invention relates to a filter block and a transceiver comprising such a filter block. More particularly, but not exclusively, the present invention relates to a filter block comprising a hybrid filter, the hybrid filter comprising first and second signal splitters connected together by signal paths, each signal path comprising a filter and a transformer.

When introducing a new cellular system such as LTE into an existing base station it is necessary to combine the transmitters using a low loss combiner. For receiving signals however if a mast head amplifier is being used then additional loss of 3 dB or more can be accommodated in both receive channels since the noise figure has already been captured.

The filter block according to the invention seeks to achieve this objective in a simple manner.

Accordingly, in a first aspect, the present invention provides A filter block comprising
  a hybrid filter, the hybrid filter comprising
    a first signal splitter having a first input port and a first output port;
    a second signal splitter having a first input port and a first output port;
    each of the first and second splitters having first and second connection ports;
    the two first connection ports being connected together by a first signal path comprising a first filter;
    the second two connection ports being connected together by a second signal path comprising a second filter;
    the first and second signal paths each further comprising a transformer connected between the filter and one of the first and second signal splitters.

Preferably, the first and second signal splitters are 3 dB hybrids.

The first and second filters can be identical.

Alternatively, the first and second filters can be different to each other.

Preferably, the first and second filters are at least one of a low pass filter, a high pass filter a band stop filter or band pass filter.

More preferably, the first and second filters are band pass filters.

The two transformers can be identical.

Preferably, the turns ratio of each of the transformers is 1:n with n preferably in the range 0.1 to 10, more preferably 0.2 to 5.

N can be substantially [sqrt(2)+1].

Alternatively n can be substantially [sqrt(2)−1].

Each transformer can be arranged between the first signal splitter and associated filter.

Alternatively, each transformer is arranged between the second signal splitter and associated filter.

The filter block can further comprise at least one directional filter connected in cascade with the hybrid filter.

The filter block can comprise a plurality of directional filters, the directional filters and hybrid filter being connected in cascade.

The filter block can further comprise a further hybrid filter connected in cascade.

In a further aspect of the invention there is provided a signal transceiver comprising
  a filter block as claimed in any one of claims 1 to 15,
  an antenna in electrical communication with the input port of the first signal splitter of the hybrid filter;
  first and second signal receivers in electrical communication with the output ports of the first and second signal splitters of the hybrid filter respectively; and,
  a signal transmitter in electrical communication with the output port of the first signal splitter of the hybrid filter.

The present invention will now be described by way of example only and not in any limitative sense with reference to the accompanying drawings in which.

Figure 1:
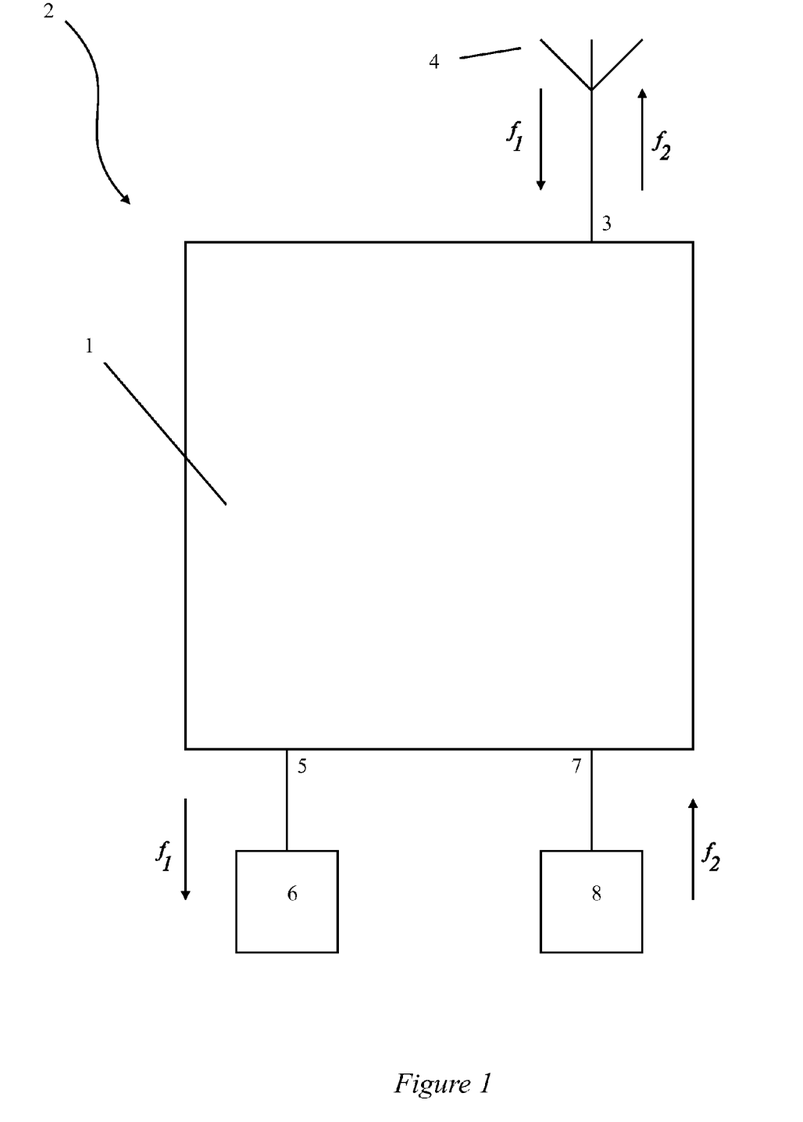
FIG. 1 shows, in schematic form, a known directional filter employed in a base station.

Shown in FIG. 1 is a known directional filter 1 forming part of a signal transceiver 2. The directional filter 1 comprises a first port 3 connected to an antenna 4, a second port 5 connected to a signal receiver 6 and a third port 7 connected to a signal transmitter 8.

In use the signal transmitter 8 provides a signal at frequency f2 to the third port 7. This passes to the first port 3 where it is radiated by the antenna 4. A signal at frequency f1 received by the antenna 4 passes to the first port 3, through the filter 1 to the second port 5 where is it received by the receiver 6.

Such directional filters 1 are known. The behaviour of such filters 1 is however not suitable for the current application.

Figure 2:
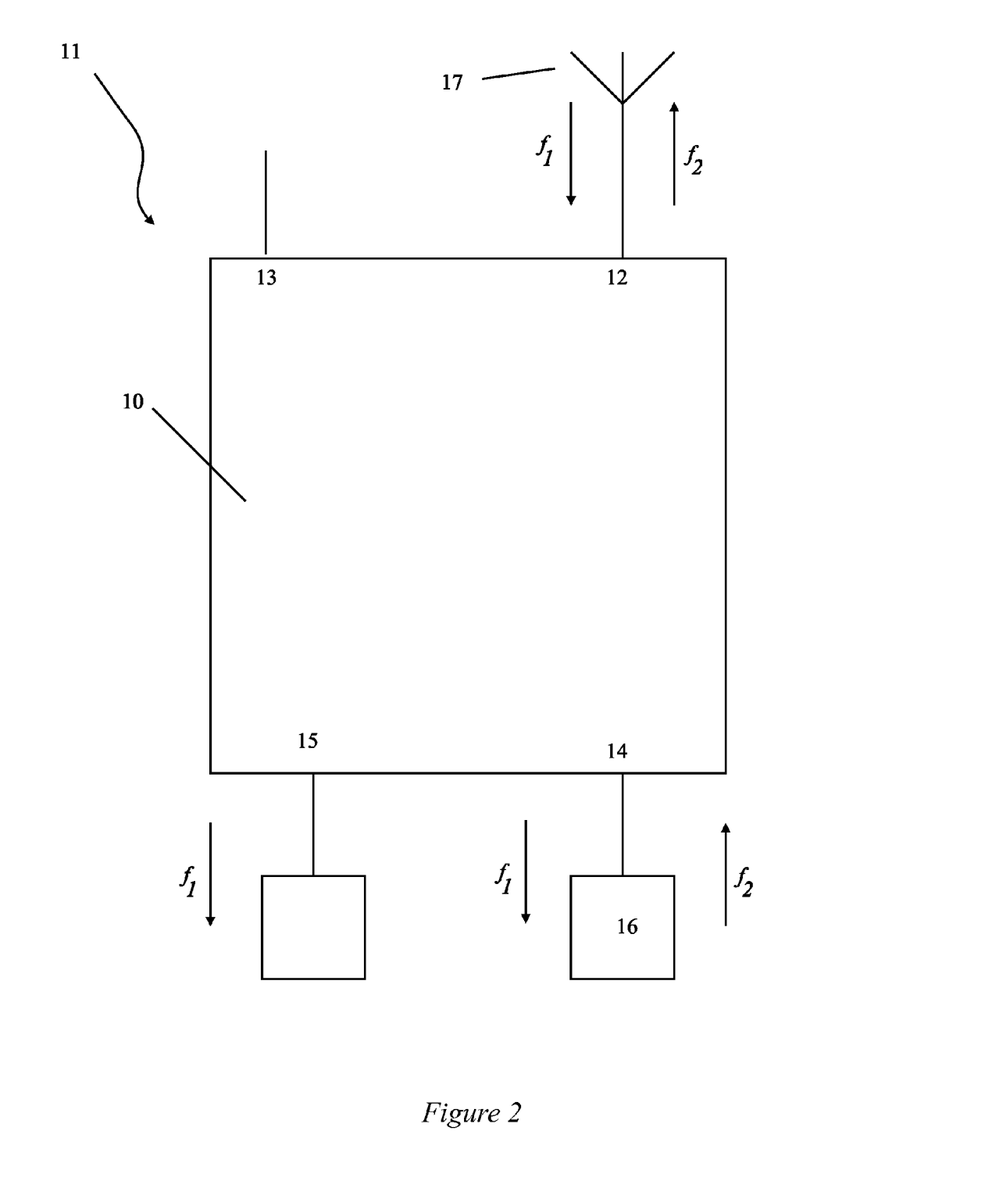
FIG. 2 shows the filter block according to the invention in schematic form.

Shown in FIG. 2 in schematic form is a filter block 10 according to the invention again forming part of a signal transceiver 11. The filter block 10 comprises first and second input ports 12,13 and first and second output ports 14,15. As before, a signal supplied to the first output port 14 at frequency f2 by a transmitter 16 exits at the first input port 12 where it is transmitted by an antenna 17. A signal of frequency f1 received at the first input port 12 from the antenna 17 however is split between the first and second output ports 14,15.

Figure 3:
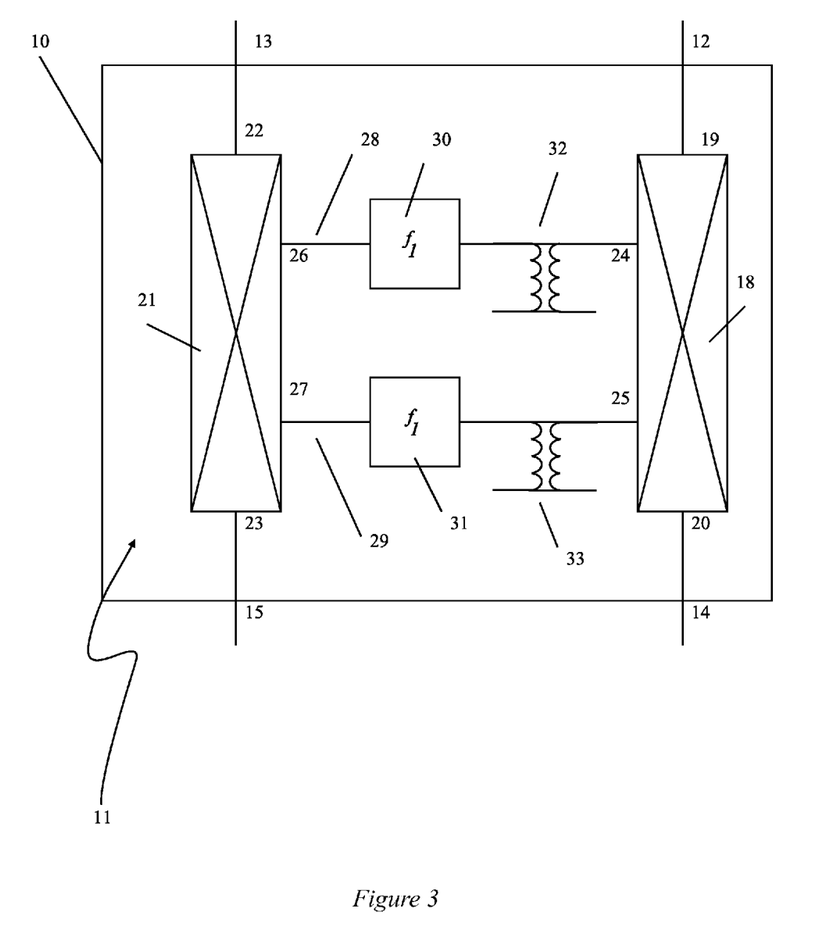
FIG. 3 shows an embodiment of a filter block according to the invention.

FIG. 3 shows an embodiment of a filter block 10 according to the invention. In this embodiment the filter block 10 comprises a hybrid filter 11. The hybrid filter 11 comprises a first signal splitter 18 having first input 19 and first output 20 ports. It further comprises a second signal splitter 21 again comprising first input 22 and first output 23 ports. In this embodiment the signal splitters 18,21 are 3 dB hybrids. The operation of such hybrids 18,21 is known in the art and will not be discussed in detail. Each of the first and second splitters 18,21 comprises first and second connection ports 24,25,26,27. The two first connection ports 24,26 are connected together by a first signal path 28. The two second connection ports 25,27 are connected together by a second signal path 29. Arranged in the first signal path 28 is a first filter 30 being a bandpass filter centred around frequency f1. Arranged in the second signal path 29 is a second filter 31 also being a bandpass filter centred around frequency f1. The two filters 30,31 are identical. Also arranged in the two signal paths 28,29 are identical transformers 32,33 as shown. The two transformers 32,33 each have a turns ratio of 1: n where n is substantially sqrt (2)+1. 'Substantially' typically means plus or minus 10%.

The first input port 19 of the first signal splitter 18 is the first input 12 of the filter block 10. The first output port 20 of the first signal splitter 18 is the first output 14 of the filter block 10. The first output port 23 of the second signal splitter 21 is the second output of the filter block 10.

Figure 4:
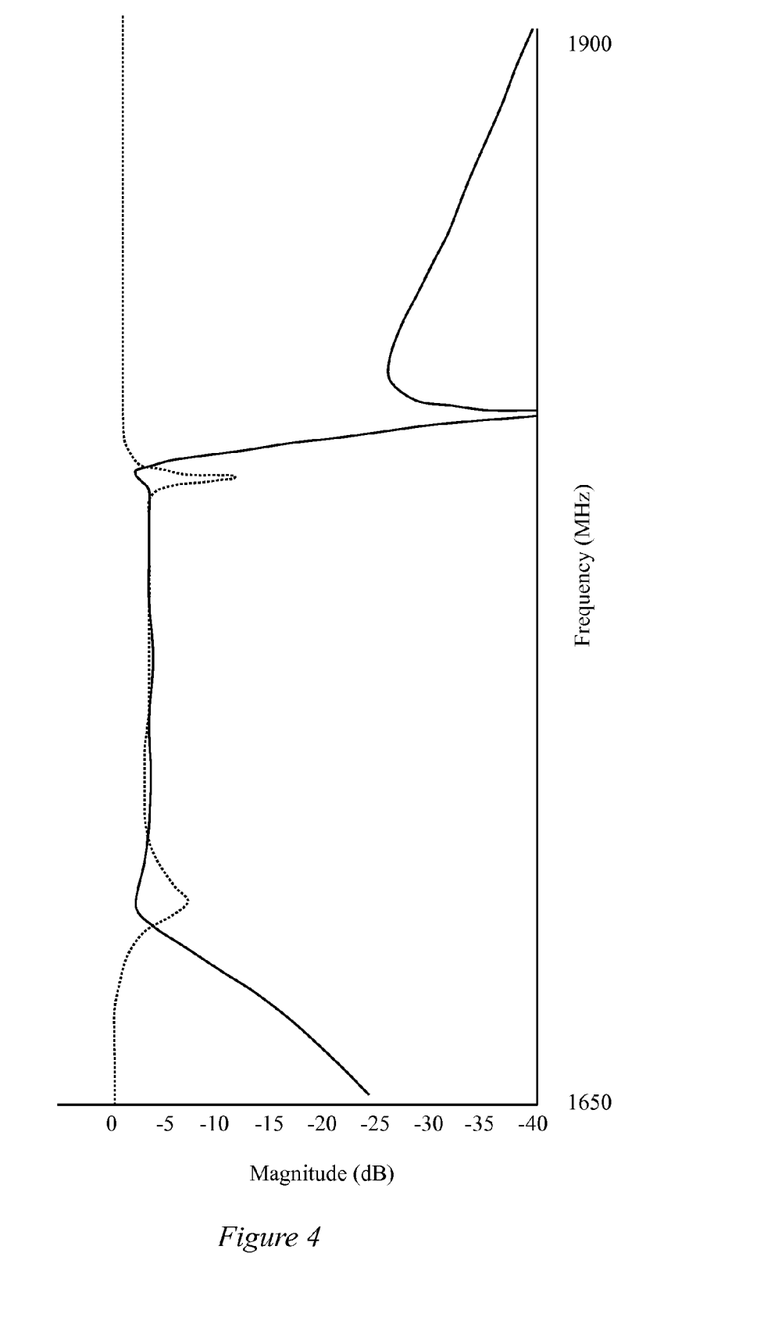
FIG. 4 shows the output of the filter block as a function of frequency for each channel.

Functionally, the operation of such a hybrid filter 11 is as described with reference to FIG. 2. The output from the two outputs 14,15 of the filter block 10 as a function of frequency of the input signal from an antenna is shown in FIG. 4. As can be seen around f1 the input signal is split substantially equally between the two outputs 14,15.

In this embodiment the signal splitters 18,21 are 3 dB splitters. In alternative embodiments other types of signal splitter 18,21 are possible.

Similarly, in alternative embodiments the turns ratio of each of the identical transformers 32,33 may be other than substantially 1:(sqrt(2)+1). In a further preferred embodiment the turns ratio is substantially 1:(sqrt(2)−1). More generally, the turns ratio is 1:n with n being preferably in the range 0.1 to 10, more preferably 0.2 to 5. In a further embodiment of the invention the two transformers 32,33 are not identical and have different turns ratios to each other. By varying the types of signal splitter 18,21 and the turns ratio one can vary how the signal received from an antenna is split between the output ports 14,15 of the filter block 10.

In the embodiment of FIG. 3 the two filters 30,31 are identical passband filters centred around a frequency f1. In an alternative embodiment the two filters 30,31 are low pass filters. In a further alternative embodiment the two filters 30,31 are high pass filters. In a further alternative embodiment the two filters 30,31 are band stop filters. In a further alternative embodiment the two filters 30, 31 are not identical, but each is selected from the options above.

Figure 5:
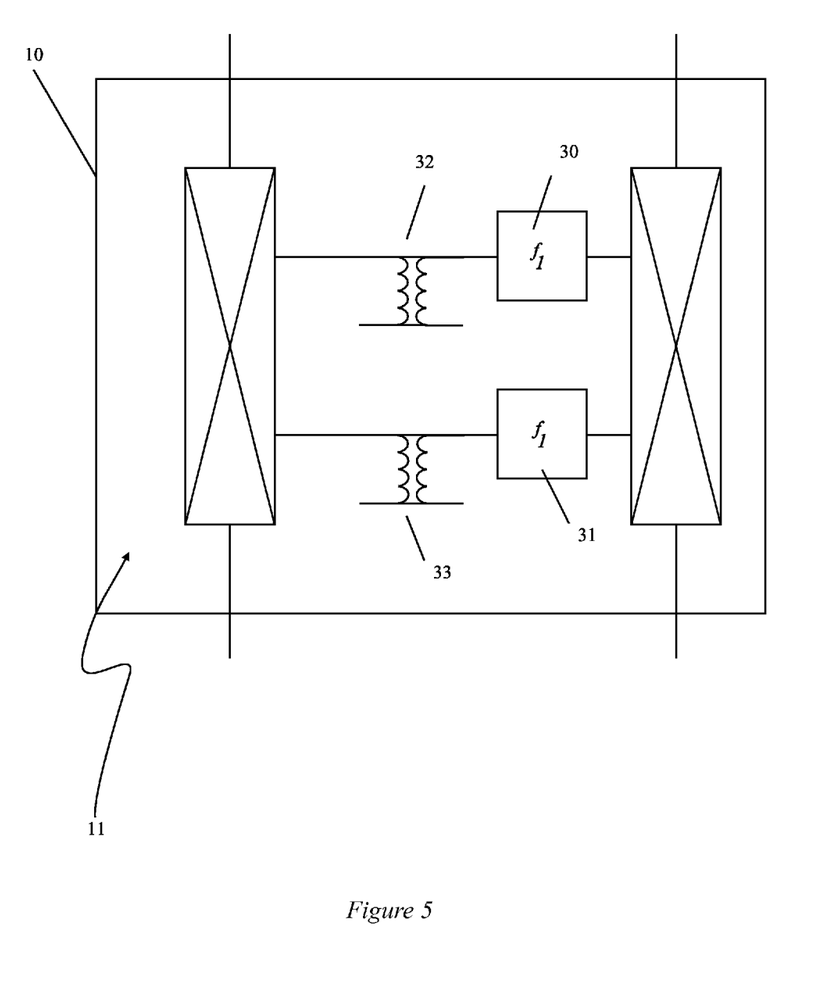
FIG. 5 shows an alternative embodiment of a hybrid filter of the filter block according to the invention.

Shown in FIG. 5 is a further alternative embodiment of the hybrid filter 11 of a filter block 10 according to the invention. In this embodiment the transformers 32,33 are arranged on the opposite side of the filters 30,31 to the embodiment shown in FIG. 3.

Figure 6:
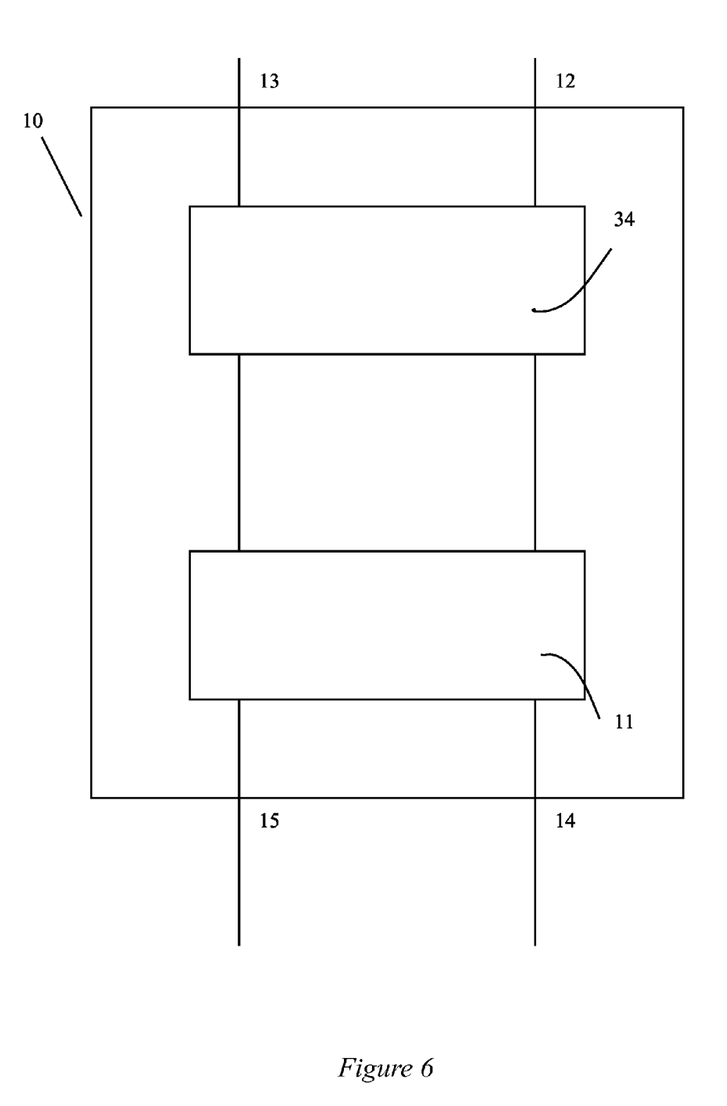
FIG. 6 shows a further embodiment of a filter block according to the invention.

Shown in FIG. 6 is a further embodiment of a filter block 10 according to the invention. This filter block 10 comprises a hybrid filter 11 as shown in FIG. 3 connected in cascade with a directional filter 34. The directional filter 34 is similar to the hybrid filter 11 but lacks the transformers 32,33. In this embodiment input ports of the directional filter 34 are the input ports 12,13 of the filter block 10.

Figure 7:
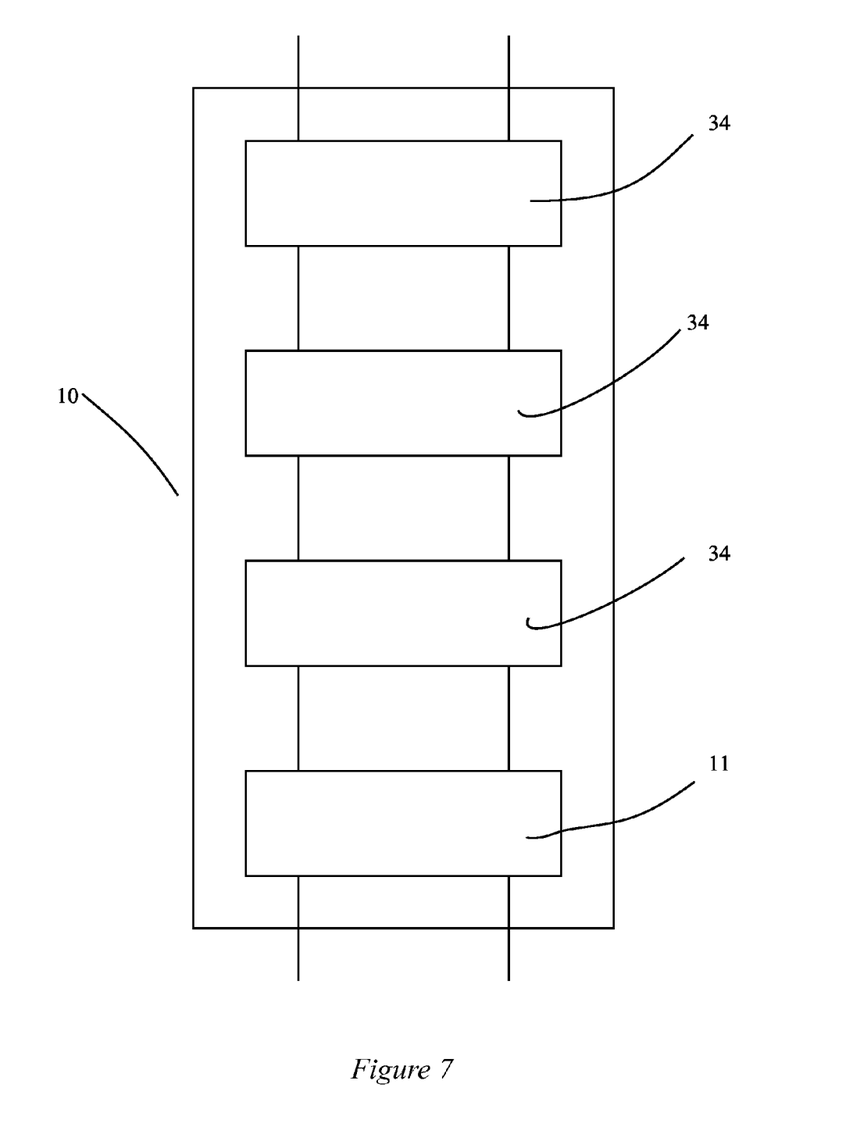
FIG. 7 shows a further embodiment of a filter block according to the invention; and, FIG. 8 shows a signal transceiver according to the invention.

Shown in FIG. 7 is a further embodiment of a filter block 10 according to the invention. This embodiment is similar to that of FIG. 6 except it comprises a plurality of directional filters 34 connected in cascade to the hybrid filter 11. In this embodiment the hybrid filter 11 is the last filter in the cascade. In alternative embodiments the hybrid filter 11 can be in other positions in the cascade. In a further alternative embodiment (not shown) the filter block 10 comprises a plurality of hybrid filters 11.

Figure 8:
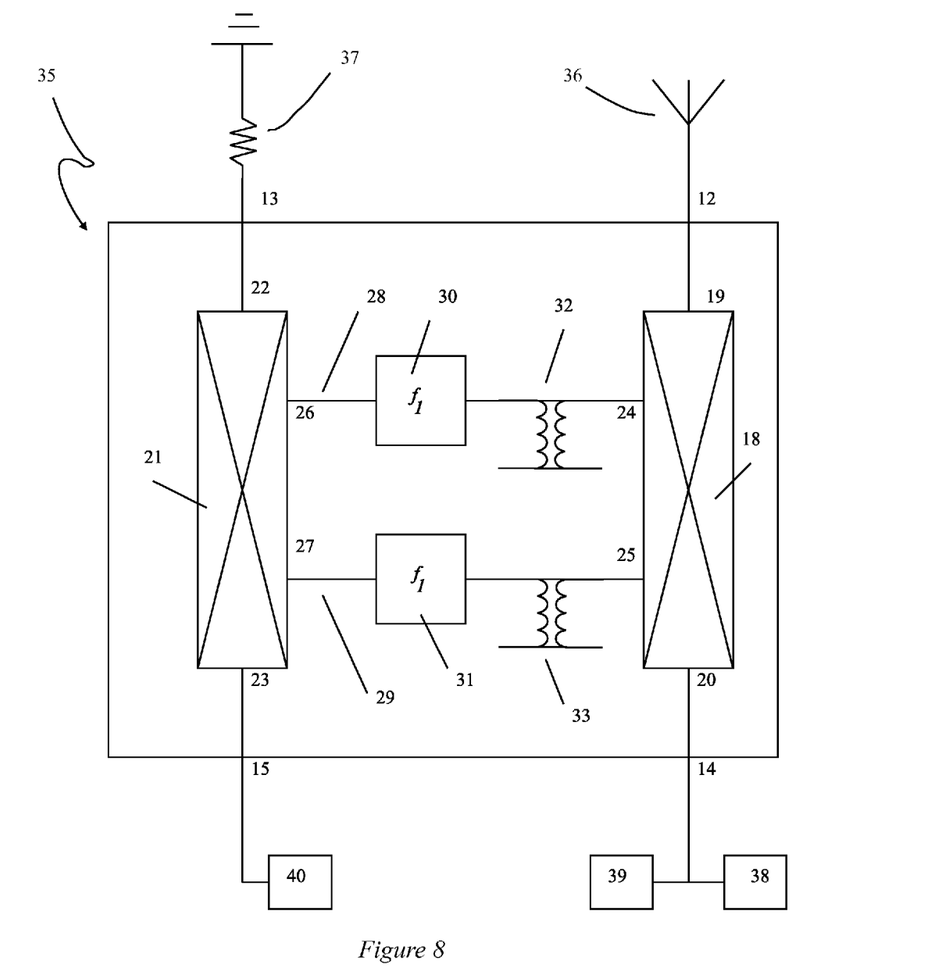

Finally, shown in FIG. 8 is a signal transceiver 35 according to the invention. The transceiver comprises a filter block 10 as described in FIG. 3. The first input 12 of the filter block 10 is connected to the antenna 36. The second input 13 of the filter block 10 is connected to a load 37 as is known. The first output 14 is connected to a signal transmitter 38 adapted to transmit a signal at frequency f2 and also a receiver 39 adapted to receive a signal at f1. The second output 15 is connected to a receiver 40 adapted to receive a signal at frequency f1. In this embodiment the antenna 36, transmitter 38 and receivers 39,40 are in direct electrical communication with the relevant ports 19,20,23 of the signal splitters 18,21 of the hybrid filter 11. In an alternative embodiment the filter block 10 includes one or more directional filters 34. In this alternative embodiment the at least one of the antenna 36, transmitter 38 and receivers 39,40 is in indirect electrical communication with the relevant ports 19,20,23 of the signal splitters 18,21 of the hybrid filter 11 through the at least one directional filter 34.

The invention claimed is:

1. A filter block comprising:
   a hybrid filter, the hybrid filter comprising:
      a first signal splitter having a first input port and a first output port;
      a second signal splitter having a first input port and a first output port;
      each of the first and second signal splitters having first and second connection ports;
      the two first connection ports being connected together by a first signal path comprising a first filter;
      the two second connection ports being connected together by a second signal path comprising a second filter;
      the first signal path further comprising a transformer connected between the first filter and one of the first connection ports; and
      the second signal path further comprising a transformer connected between the second filter and one of the second connection ports;
      wherein the turns ratio of each of the transformers is 1:n, wherein n is substantially sqrt(2)+1 or sqrt(2)−1.

2. A filter block as claimed in claim 1, wherein the first and second signal splitters are 3 dB hybrids.

3. A filter block as claimed in claim 1, wherein the first and second filters are identical.

4. A filter block as claimed in claim 1, wherein the first and second filters are different from each other.

5. A filter block as claimed in claim 1, wherein each of the first and second filters is at least one of a low pass filter, a high pass filter, a band stop filter, or band pass filter.

6. A filter block as claimed in claim 5, wherein the first and second filters are band pass filters.

7. A filter block as claimed in claim 1, wherein the two transformers are identical.

8. A filter block as claimed in claim 1, wherein each transformer is arranged between the first signal splitter and the first filter.

9. A filter block as claimed in claim 1, wherein each transformer is arranged between the second signal splitter and the second filter.

10. A filter block as claimed in claim 1, further comprising at least one directional filter connected in cascade with the hybrid filter.

11. A filter block as claimed in claim 10, further comprising a plurality of directional filters, the plurality of directional filters and the hybrid filter being connected in cascade.

12. A signal transceiver comprising:
   a filter block comprising:
      a hybrid filter, the hybrid filter comprising:
         a first signal splitter having a first input port and a first output port;
         a second signal splitter having a first input port and a first output port;

each of the first and second signal splitters having first and second connection ports;

the two first connection ports being connected together by a first signal path comprising a first filter;

the two second connection ports being connected together by a second signal path comprising a second filter;

the first signal path further comprising a transformer connected between the first filter and one of the first connection ports; and the second signal path further comprising a transformer connected between the second filter and one of the second connection ports;

wherein the turns ratio of each of the transformers is 1:n, wherein n is substantially sqrt(2)+1 or sqrt(2)−1;

an antenna in electrical communication with the input port of the first signal splitter of the hybrid filter;

first and second signal receivers in electrical communication with the output ports of the first and second signal splitters of the hybrid filter respectively; and a signal transmitter in electrical communication with the output port of the first signal splitter of the hybrid filter.

* * * * *